(12) United States Patent
Brink

(10) Patent No.: US 6,313,609 B1
(45) Date of Patent: Nov. 6, 2001

(54) DETERMINING BATTERY CAPACITY USING ONE OR MORE APPLICATIONS OF A CONSTANT POWER LOAD

(76) Inventor: Gregory D. Brink, 8197 Mabrey La., Bainbridge Island, WA (US) 98110

( * ) Notice: Subject to any disclaimer, the term of this patent is extended or adjusted under 35 U.S.C. 154(b) by 0 days.

(21) Appl. No.: 09/692,262

(22) Filed: Oct. 19, 2000

(51) Int. Cl.⁷ .................................................. H02J 7/00
(52) U.S. Cl. ........................................................ 320/132
(58) Field of Search ................................... 320/136, 132, 320/134, 152, 427, 430

(56) References Cited

U.S. PATENT DOCUMENTS

| | | | |
|---|---|---|---|
| 4,948,683 | 8/1990 | Picozzi et al. | 429/90 |
| 4,949,028 | 8/1990 | Brune | 320/116 |
| 4,968,567 | 11/1990 | Schisselbauer | 429/90 |
| 5,122,751 | 6/1992 | Aita et al. | 324/429 |
| 5,352,968 | * 10/1994 | Reni et al. | 320/157 |
| 5,369,364 | * 11/1994 | Renirie et al. | 324/430 |
| 5,411,817 | 5/1995 | Ridgway et al. | 429/90 |
| 5,478,665 | 12/1995 | Burroughs et al. | 429/90 |
| 5,587,924 | * 12/1996 | Rossi | 702/63 |
| 5,600,231 | 2/1997 | Parker | 320/136 |
| 5,604,049 | 2/1997 | Weiss et al. | 429/93 |
| 5,614,333 | 3/1997 | Hughen et al. | 429/93 |
| 5,614,804 | 3/1997 | Kayano et al. | 320/134 |
| 5,626,978 | 5/1997 | Weiss et al. | 429/43 |
| 5,646,508 | * 7/1997 | van Phuoc et al. | 320/152 |
| 5,650,937 | 7/1997 | Bounaga | 702/65 |
| 5,658,316 | 8/1997 | Lamond et al. | 607/5 |
| 5,691,621 | * 11/1997 | Phuoc et al. | 320/134 |
| 5,709,962 | 1/1998 | Bailey | 429/93 |
| 5,721,482 | 2/1998 | Benvegar et al. | 320/43 |
| 5,751,217 | 5/1998 | Kchao et al. | 340/636 |
| 5,773,961 | 6/1998 | Cameron et al. | 320/132 |
| 5,773,978 | 6/1998 | Becker | 324/430 |
| 5,789,899 | * 8/1998 | van Phuoc et al. | 320/133 |
| 5,841,284 | 11/1998 | Takahashi | 324/426 |
| 5,889,388 | * 3/1999 | Cameron et al. | 320/166 |
| 5,912,544 | * 6/1999 | Miyakawa et al. | 320/152 |
| 5,969,508 | 10/1999 | Patino et al. | 320/153 |
| 5,990,664 | * 11/1999 | Rahman | 320/136 |
| 5,998,972 | * 12/1999 | Gong | 320/134 |
| 5,998,973 | 12/1999 | Tsai | 320/135 |
| 6,037,749 | * 3/2000 | Parsonage | 320/132 |
| 6,107,779 | 8/2000 | Hara et al. | 320/132 |
| 6,114,838 | 9/2000 | Brink et al. | 320/136 |
| 6,150,823 | * 11/2000 | Takahashi et al. | 324/427 |

\* cited by examiner

*Primary Examiner*—Peter S. Wong
*Assistant Examiner*—Pia Tibbits

(57) ABSTRACT

A system and associated methodology for quickly and accurately determining a remaining capacity of a battery. The system measures battery terminal voltage during each application of one or more constant power loads to the battery, and compares either the measured voltage, or an internal impedance calculated from the measured voltage, with a pre-characterization of the relationship between battery capacity and battery voltage or impedance for the given battery type and operating conditions. This relationship may be obtained from data provided by the battery manufacturer, derived empirically or otherwise determined. This relationship may be represented by data stored in memory or by a mathematical function implemented in hardware, software, firmware or a combination thereof.

26 Claims, 10 Drawing Sheets

| Pre-characterized Battery Capacity Data and Internal Impedance (Multiple Applications of a Constant Power Load) ||||
|---|---|---|---|
| # | Battery Chemistry [C] | Applied Constant Power Loads [$P_1, P_2$] | Sensed Ambient Temperature [T] | Impedance [Z] v. Capacity [%E] Table 412 |
| 1 | NiCd | 2 watts, 8 watts | -10-0 °C | Table 1 |
| 2 | | | 0-10° C | Table 2 |
| 3 | | | 10-20 °C | Table 3 |
| 4 | | | 20-30° C | Table 4 |
| 5 | | | 30-40° C | Table 5 |
| 6 | | | 40-50° C | Table 6 |
| 7 | | | 50-60° C | Table 7 |
| 8 | | | . . . | |
| 9 | NiCd | 5 watts, 10 watts | -10-0 °C | Table 8 |
| 10 | | | 0-10° C | Table 9 |
| 11 | | | 10-20 °C | Table 10 |
| 12 | | | 20-30° C | Table 11 |
| 13 | | | 30-40° C | Table 12 |
| 14 | | | 40-50° C | Table 13 |
| 15 | | | 50-60° C | Table 14 |
| 16 | | | . . . | |
| 17 | | . . . | | |
| 18 | SLA | 1 watt, 4 watts | -10-0 °C | Table 15 |
| 19 | | | 0-10° C | Table 16 |
| 20 | | | 10-20 °C | Table 17 |
| 21 | | | 20-30° C | Table 18 |
| 22 | | | 30-40° C | Table 19 |
| 23 | | | 40-50° C | Table 20 |
| 24 | | | 50-60° C | Table 21 |
| 25 | | | . . . | |
| 26 | SLA | 7 watts, 16 watts | -10-0 °C | Table 22 |
| 27 | | | 0-10° C | Table 23 |
| 28 | | | 10-20 °C | Table 24 |
| 29 | | | 20-30° C | Table 25 |
| 30 | | | 30-40° C | Table 26 |
| 31 | | | 40-50° C | Table 27 |
| 32 | | | 50-60° C | Table 28 |
| 33 | | | . . . | |
| 34 | | . . . | | |
| 34 | . . . | | | |

Figure 5A

| Pre-characterized Battery Capacity Data and Terminal Voltage (Single Application of a Constant Power Load) | | | | |
|---|---|---|---|---|
| Row # | Battery Chemistry [C] | Applied Constant Power Load [P] | Sensed Ambient Temperature [T] | Voltage [V] v. Capacity [%E] Table 412 |
| 1 | NiCd | 2 watts | -10-0 ° C | Table 1 |
| 2 | | | 0-10° C | Table 2 |
| 3 | | | 10-20 ° C | Table 3 |
| 4 | | | 20-30° C | Table 4 |
| 5 | | | 30-40° C | Table 5 |
| 6 | | | 40-50° C | Table 6 |
| 7 | | | 50-60° C | Table 7 |
| 8 | | | . . . | |
| 9 | NiCd | 5 watts | -10-0 ° C | Table 8 |
| 10 | | | 0-10° C | Table 9 |
| 11 | | | 10-20 ° C | Table 10 |
| 12 | | | 20-30° C | Table 11 |
| 13 | | | 30-40° C | Table 12 |
| 14 | | | 40-50° C | Table 13 |
| 15 | | | 50-60° C | Table 14 |
| 16 | | | . . . | |
| 17 | | . . . | | |
| 18 | SLA | 5 watts | -10-0 ° C | Table 15 |
| 19 | | | 0-10° C | Table 16 |
| 20 | | | 10-20 ° C | Table 17 |
| 21 | | | 20-30° C | Table 18 |
| 22 | | | 30-40° C | Table 19 |
| 23 | | | 40-50° C | Table 20 |
| 24 | | | 50-60° C | Table 21 |
| 25 | | | . . . | |
| 26 | SLA | 10 watts | -10-0 ° C | Table 22 |
| 27 | | | 0-10° C | Table 23 |
| 28 | | | 10-20 ° C | Table 24 |
| 29 | | | 20-30° C | Table 25 |
| 30 | | | 30-40° C | Table 26 |
| 31 | | | 40-50° C | Table 27 |
| 32 | | | 50-60° C | Table 28 |
| 33 | | | . . . | |
| 34 | | . . . | | |
| 34 | . . . | | | |

FIGURE 5B

DETERMINING BATTERY CAPACITY USING ONE OR MORE APPLICATIONS OF A CONSTANT POWER LOAD

BACKGROUND OF THE INVENTION

1. Field of the Invention

The present invention relates generally to batteries and, more particularly, to determining the remaining capacity of a battery.

2. Related Art

Sudden cardiac arrest has been attributed to over 350,000 deaths each year in the United States, making it one of the country's leading medical emergencies. Worldwide, sudden cardiac arrest has been attributed to a much larger number of deaths each year. One of the most common and life threatening consequences of a heart attack is the development of a cardiac arrhythmia, commonly referred to as ventricular fibrillation. When in ventricular fibrillation, the heart muscle is unable to pump a sufficient volume of blood to the body and brain. The lack of blood and oxygen to the brain may result in brain damage, paralysis or death to the victim.

The probability of surviving a heart attack or other serious heart arrhythmia depends on the speed with which effective medical treatment is provided. If prompt cardiopulmonary resuscitation is followed by defibrillation within approximately four minutes of the onset of symptoms, the probability of survival can approach or exceed fifty percent. Prompt defibrillation within the first critical minutes is, therefore, considered one of the most important components of emergency medical treatment for preventing death from sudden cardiac arrest.

Cardiac defibrillation is an electric shock that is applied to the victim to arrest the chaotic cardiac contractions that occur during ventricular fibrillation, and to restore a normal cardiac rhythm. To administer such an electrical shock to the heart, defibrillator pads are placed on the victim's chest, and an electrical impulse of the proper magnitude and shape is administered to the victim through the pads. While defibrillators have been known for years, they have typically been complicated, making them suitable for use by trained personnel only.

Recently, portable and transportable automatic and semi-automatic external defibrillators (generally, AEDs) for use by first responders have been developed. A portable defibrillator allows proper medical care to be given to a victim earlier than preceding defibrillators, increasing the likelihood of survival. Portable AEDs may be brought to or stored in an accessible location at a business, home, aircraft or the like, available for use by first responders. With recent advances in technology, even a minimally trained individual can operate conventional portable defibrillators to aid a victim in the critical first few minutes subsequent to the onset of sudden cardiac arrest.

Portable defibrillators require a portable energy source to operate in the anticipated mobile environments. Typically, AEDs utilize battery packs as the portable energy source. Several manufacturers have provided battery packs for use in portable defibrillators, such as a sealed lead acid (SLA) battery, a nickel cadmium (NiCd) battery, a lithium ion (Li) battery, and the like.

AEDs can remain unused in their storage area for hours, days or even weeks without having been tested or otherwise maintained, and months or even years without actually being used. During such extended periods of time, the installed battery may discharge significantly and have insufficient energy to charge the AED during use. Thus, to ensure reliable AED operations, it is important that the condition of the installed battery be determined during use. The user can then determine when to replace the battery.

A conventional technique for measuring remaining battery capacity is commonly referred to as a battery fuel gauge. With this technique, a battery monitoring circuit measures the current output from the battery during use, and, in the case of rechargeable batteries, the current input to the battery during charging cycles. The battery monitoring circuit determines the remaining capacity of the battery based on a tally of the cumulative input and output currents.

A drawback to this approach is that this approach requires the use of an expensive, low-power analog and digital circuit designed to monitor the battery continually to calculate self-discharge quantities during the storage of the device. Another significant drawback is that the requisite current sensor is lossy, reducing the efficiency of the device. Furthermore, due to risks commonly associated with such a technique, a supplemental measurement technique is often implemented concurrently. In addition, the test device must be re-calibrated periodically to adjust for changes in the battery capacity over the cycle life of a rechargeable battery.

SUMMARY OF THE INVENTION

The present invention is a system and associated methodology for quickly and accurately determining a remaining capacity of a battery. The present invention measures battery terminal voltage during each application of one or more constant power loads to the battery, and compares either the measured voltage, or an internal impedance calculated from the measured voltage, with a pre-characterization of the relationship between battery capacity and battery voltage or impedance for the given battery and test conditions. This relationship may be obtained from data provided by the battery manufacturer, derived empirically or otherwise determined. This relationship may be represented by data stored in memory or by a mathematical function implemented in hardware, software, firmware or a combination thereof.

There are a number of advantages associated with the present invention. For example, the approach of the present invention does not require the use of a current sensor, thereby avoiding the associated losses. In addition, the present invention is considerably less expensive and easier to implement than conventional approaches since no circuit is required to be added to the battery to monitor self discharges, nor does the present invention need to be re-calibrated over the life of the battery. A particular benefit is provided when the present invention is implemented in devices also having a constant power source. One such device is an AED in which a constant power capacitor charger is implemented. In such devices, the existing charger controller can be utilized to draw constant power while terminal voltage is measured.

A number of aspects of the invention are summarized below, along with different embodiments that may be implemented for each of the summarized aspects. It should be understood that the summarized embodiments are not necessarily inclusive or exclusive of each other and may be combined in any manner in connection with the same or different aspects that are non-conflicting and otherwise possible. These disclosed aspects of the invention, which are directed primarily to systems and methodologies for determining the capacity of a battery, are exemplary aspects only and are also to be considered non-limiting.

In one aspect of the invention, a battery capacity tester for determining a remaining capacity of a battery is disclosed. The tester applies one or more constant power loads to the battery and determines the battery capacity associated with a selected one of either a measured battery voltage or calculated battery impedance based on a pre-characterized relationship between battery capacity and the selected voltage or impedance.

In one embodiment, one predetermined constant power load is applied. In this embodiment, the tester determines the remaining battery capacity based on the pre-characterized relationship between battery voltage and battery capacity for similar batteries under similar test conditions. In one embodiment, the battery capacity tester includes a constant power source that applies the predetermined constant power load. A battery characterizer measures the battery voltage during the constant power draw, and determines the remaining battery capacity based on the pre-characterized relationship between battery voltage and capacity, wherein the pre-characterized relationship corresponds to batteries having similar characteristics under similar test conditions. Such similar battery characteristics include, for example, battery chemistry and battery voltage rating, while such similar test conditions can include, for example, applied constant power load, temperature, etc. The battery characterizer, in one embodiment, includes a voltage measurement device for measuring the battery terminal voltage, and a memory having stored therein data representing the pre-characterized relationship. Specifically, in one embodiment, the pre-characterization data associates the battery voltage and capacity for a corresponding battery chemistry and applied constant power load. A battery capacity determinator retrieves a battery capacity value from the memory based on the measured battery voltage, the chemistry of the battery and the applied constant power load. Preferably, the pre-characterized data also corresponds to the test condition of battery temperature, and the determinator retrieves the remaining battery capacity also based on a measured battery temperature. Alternatively, the pre-characterized relationship is represented by a mathematical formula implemented in a computational element.

The constant power source includes a load that consumes power; and a constant power regulator operationally interposed between the battery and the load, to control the power drawn from the battery by the load to provide the constant power load application. When implemented in an electrotherapy device, the constant power source can be implemented as a capacitor and capacitor charger of the electrotherapy device.

In another embodiment, the one or more applications of a constant power load includes a first application of first predetermined constant power load, and a second application of second predetermined constant power load. The sensed battery voltage includes a first battery voltage measured during the first constant power draw and a second battery voltage measured during the second constant power draw. In this embodiment, the tester determines the remaining battery capacity based on a pre-characterized relationship between internal battery impedance and battery capacity. The impedance is derived from a relationship between the first and second battery voltages and the first and second applied constant power loads.

In one embodiment, the battery capacity tester includes a constant power source configured to apply, in two successive occurrences, the first and second predetermined constant power loads. The tester also includes a battery characterizer configured to sense the first and second battery voltages and battery temperature during each constant power draw, and to determine remaining battery capacity based on the battery impedance, temperature and chemistry.

In another aspect of the invention an electrotherapy device is disclosed. The electrotherapy device includes an energy delivery system with one or more capacitors and a capacitor charger. A battery capacity tester determines a capacity remaining in a battery installed in the electrotherapy device. The tester applies one or more constant power loads to the battery and compares a selected one of either a measured battery voltage or a battery impedance calculated therefrom to a pre-characterized relationship between battery capacity and the selected voltage or impedance. The referenced pre-characterized relationship is one of a plurality of pre-characterized relationships, each corresponding to batteries having certain characteristics and certain test conditions. The referenced pre-characterized relationship is that relationship corresponding to batteries having characteristics and test conditions most similar to those characteristics of the battery and current test conditions. In one embodiment, the battery characteristics include battery chemistry and the test conditions include battery temperature and the one or more constant power loads.

In one embodiment, the one or more applications of a constant power load include one application of a predetermined constant power load. Here, the tester determines the remaining battery capacity based on a pre-characterized relationship between battery voltage and battery capacity for the battery at the one applied constant power load. In another embodiment, the one or more applications of a constant power load includes a first application of first predetermined constant power load, and a second application of second predetermined constant power load. The sensed battery voltage comprises a first battery voltage measured during the first constant power application and a second battery voltage measured during the second constant power application. Here, the tester determines the remaining battery capacity based on a pre-characterized relationship between internal battery impedance and battery capacity, wherein the impedance is derived from a relationship between the battery voltages and applied power loads.

In a further aspect of the invention, a method for determining remaining battery capacity of a battery is disclosed. The method includes the steps of: (1) receiving indications of battery chemistry and temperature; and (2) applying successively a first and a second constant power load to the battery; (3) measuring first and second terminal voltages of the battery during each constant power load application performed in step 2); (4) calculating internal battery impedance based on the applied constant power levels and the corresponding first and second measured voltages; and (5) determining remaining battery capacity based on a pre-characterized relationship of battery impedance and battery capacity for batteries having a same or similar chemistry and temperature as the tested battery subject to approximately the same first and second power loads as the tested battery.

In a still further aspect of the invention, a method for determining remaining battery capacity of a tested battery is disclosed. This method includes the steps of: (1) receiving indications of battery chemistry and temperature; (2) applying a constant power load to the battery; (3) measuring a terminal voltage of the battery during the constant power load application performed in step 2); and (4) determining remaining battery capacity based on a pre-characterized relationship of battery voltage and battery capacity for batteries having a substantially the same chemistry and temperature as the tested battery subject to same constant power load as the tested battery.

Various embodiments of the present invention provide certain advantages and overcome certain drawbacks of the conventional techniques. Not all embodiments of the invention share the same advantages and those that do may not share them under all circumstances. These and other features and advantages of the present invention as well as the structure and operation of various embodiments of the present invention are described in detail below with reference to the accompanying drawings.

BRIEF DESCRIPTION OF THE DRAWINGS

This invention is pointed out with particularity in the appended claims. The above and further features and advantages of this invention may be better understood by referring to the following description when taken in conjunction with the accompanying drawings. In the drawings, like reference numerals indicate identical or functionally similar elements. Additionally, the left most one or two digits of a reference numeral identify the drawing in which the reference numeral first appears. In the drawings:

FIG. 5A is an illustration of a table associating look-up tables with corresponding selection criteria for use in one embodiment of the invention.

FIG. 5B is an illustration of a table associating look-up tables with corresponding selection criteria for use in another embodiment of the invention.

DETAILED DESCRIPTION

The present invention is directed to a battery capacity testing system and associated methodology that determines the remaining capacity of a battery pack. The present invention measures battery terminal voltage during each application of one or more constant power loads to the battery, and compares either the measured voltage, or an internal impedance calculated from the measured voltage, with a pre-characterization of the relationship between battery capacity and battery voltage or impedance for the given battery type and operating conditions. This relationship may be obtained from data provided by the battery manufacturer, derived empirically or otherwise determined. This relationship may be represented by data stored in memory or by a mathematical function implemented in hardware, software, firmware or a combination thereof. For batteries that can be reasonably well characterized and which exhibit reasonably predictable behavior, the battery capacity is preferably determined based on a pre-characterized relationship between battery voltage and remaining battery capacity. For batteries that can not be reasonably well characterized with one power level measurement or which do not exhibit reasonably predictable behavior, two or more predetermined constant power loads are applied to the battery. The constant power levels and corresponding measured terminal voltages are used to calculate internal battery impedance. The remaining battery capacity is determined based on pre-characterized relationship between battery impedance and battery capacity. As used herein the term battery refers to any type of rechargeable or non-rechargeable battery or battery pack with any number of cells. The referenced pre-characterized relationship is one of a plurality of pre-characterized relationships, each corresponding to batteries having certain characteristics and certain test conditions. The referenced pre-characterized relationship is that relationship corresponding to batteries having characteristics and test conditions most similar to those characteristics of the battery and current test conditions. In one embodiment, the battery characteristics include battery chemistry and the test conditions include battery temperature and the applied constant power load(s).

Figure 1A:
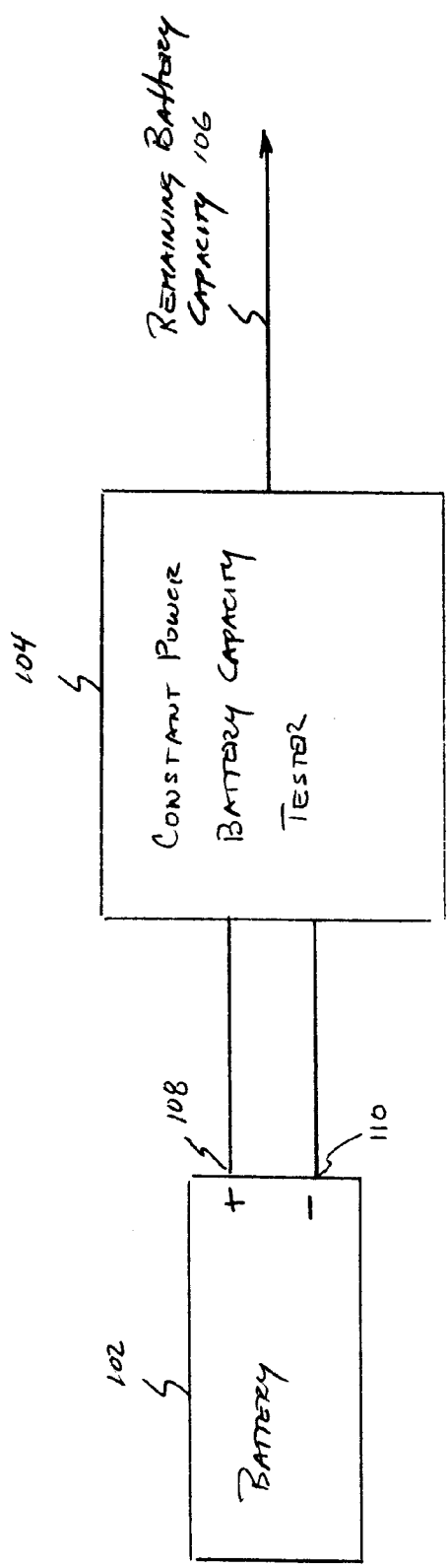
FIG. 1A is a high-level block diagram of a battery capacity tester in accordance with one embodiment of the present invention.

FIG. 1A is a high-level block diagram of a battery capacity tester for determining remaining battery capacity of a battery 102. Battery 102 is electrically connected to the constant power battery capacity tester 104 at positive terminal 108 and negative terminal 110. Battery capacity tester 104 generates a remaining battery capacity 106 in accordance with the teachings of the present invention. In one embodiment, tester 104 is implemented in a battery-powered device. In these and other battery-powered devices, battery 102 is typically installed in, and provides power to, the battery-powered device.

Figure 1B:
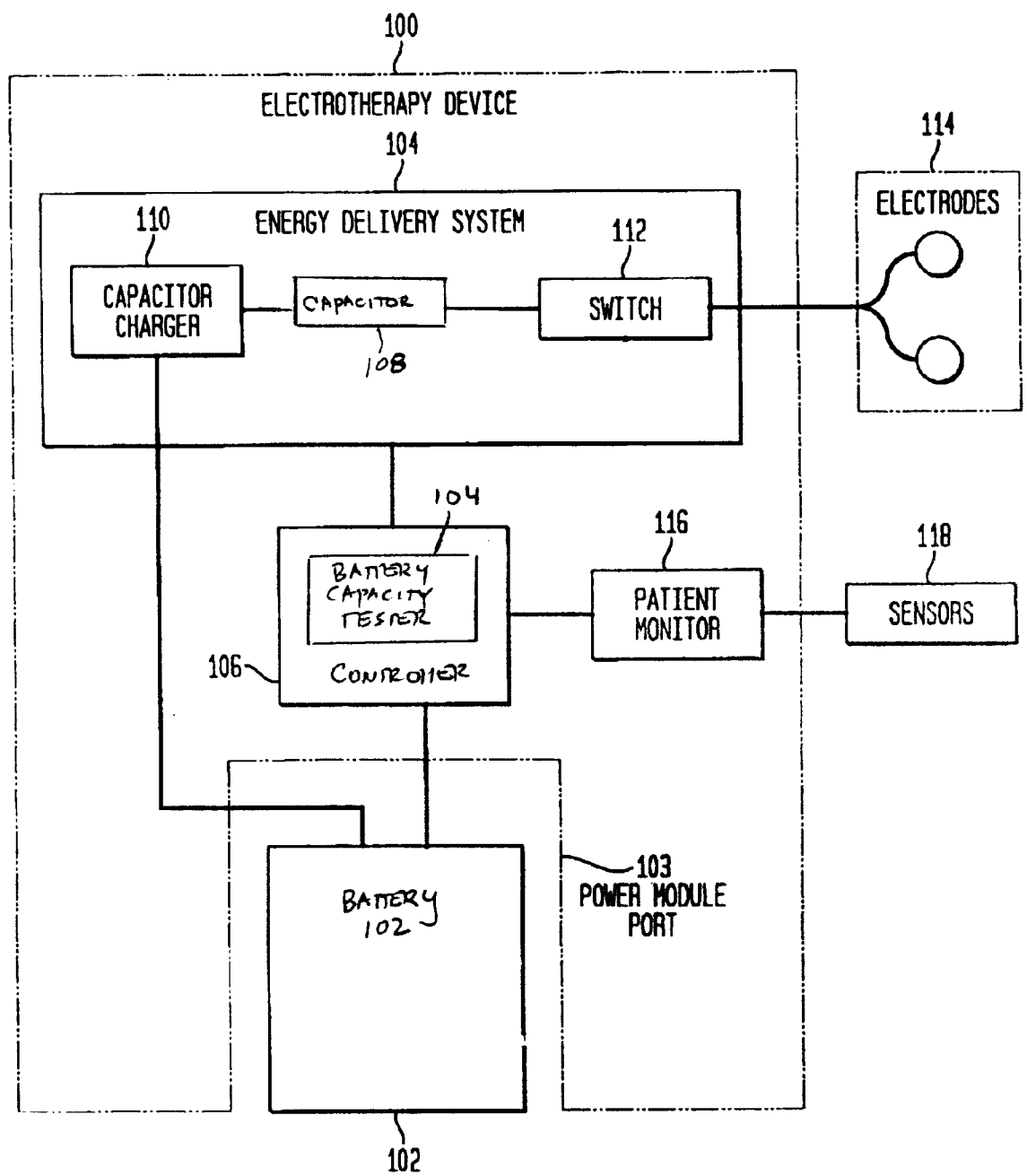
FIG. 1B is a block diagram of an exemplary electrotherapy device implementing one embodiment of the battery capacity tester illustrated in FIG. 1A.

Aspects and embodiments of the present invention will be described herein with reference to a particular type of battery-powered device commonly known as an electrotherapy device. Electrotherapy devices are used to provide electrical shocks to treat patients for a variety of heart arrhythmias. FIG. 1B is a simplified block diagram of an exemplary electrotherapy device 100. Electrotherapy device 100 may include the necessary components to defibrillate, cardiovert or pace a patient, or to perform any combination of such operations. It should be appreciated that since such electrotherapy devices are well known in the art, the components described herein and illustrated in FIG. 1B are exemplary only. In the following description it is envisioned that electrotherapy device 100 is a portable automatic or semiautomatic external defibrillator (generally, AEDs) such as the many models of portable defibrillators available from Agilent Technologies, Palo Alto, Calif.

Components of electrotherapy device 100 operate under the control of a controller 106. Controller 106 may be embodied in a microprocessor, gate array, ASIC, or other control logic architecture, as well as any combination thereof. Preferably, controller 106 is implemented in software code that is executed on a commercially available microprocessor. Generally, such software code is stored in a memory device (not shown) accessible by the microprocessor.

Electrotherapy device 100 includes an energy delivery system 104 that delivers energy to a patient (not shown). Energy delivery system 104 is connected to electrodes 114 and includes generally a capacitor or capacitor bank 108, a capacitor charger 110 and a switching mechanism 112. In response to controller 106, energy delivery system 104 delivers an electric shock from capacitor 108 to electrodes 114 that are placed on the patient's chest.

Patient monitor 116 monitors the patient's heart rhythm and determines whether the monitored rhythm is shockable. Patient monitor 116 receives information from sensors 118, which may be integrated in electrodes 114, as physically separate devices or a combination thereof. Patient monitor 116 communicates a shock decision to controller 106. Energy delivery system 104 then delivers a therapeutic energy pulse to the patient via electrodes 114.

These and other components of electrotherapy device 100 are well known in the art. Electrotherapy devices suitable for implementing the present invention may include the same or similar device components now or later developed. The above and other device components not specifically described in this application can be included and configured to operate in the manner described in U.S. Pat. No. 5,607,454 to Cameron et al., entitled "Electrotherapy Method and Apparatus," the disclosure of which is incorporated herein by reference in its entirety.

In accordance with the exemplary aspects of the present invention, device 100 includes a constant power battery capacity tester 104 that determines the remaining capacity of an installed battery 102 which can be a non-rechargeable or a rechargeable battery. In this illustrative embodiment, electrotherapy device 100 includes a power module receptacle 103 in which a battery 102 is installed. A battery chemistry identifier (not shown) is preferably included either in electrotherapy device 100 or in battery 102 should the implemented embodiment of battery 102 include some form of data storage or logic, to provide tester 104 with an indication of the chemistry of installed battery 102.

Figure 2:
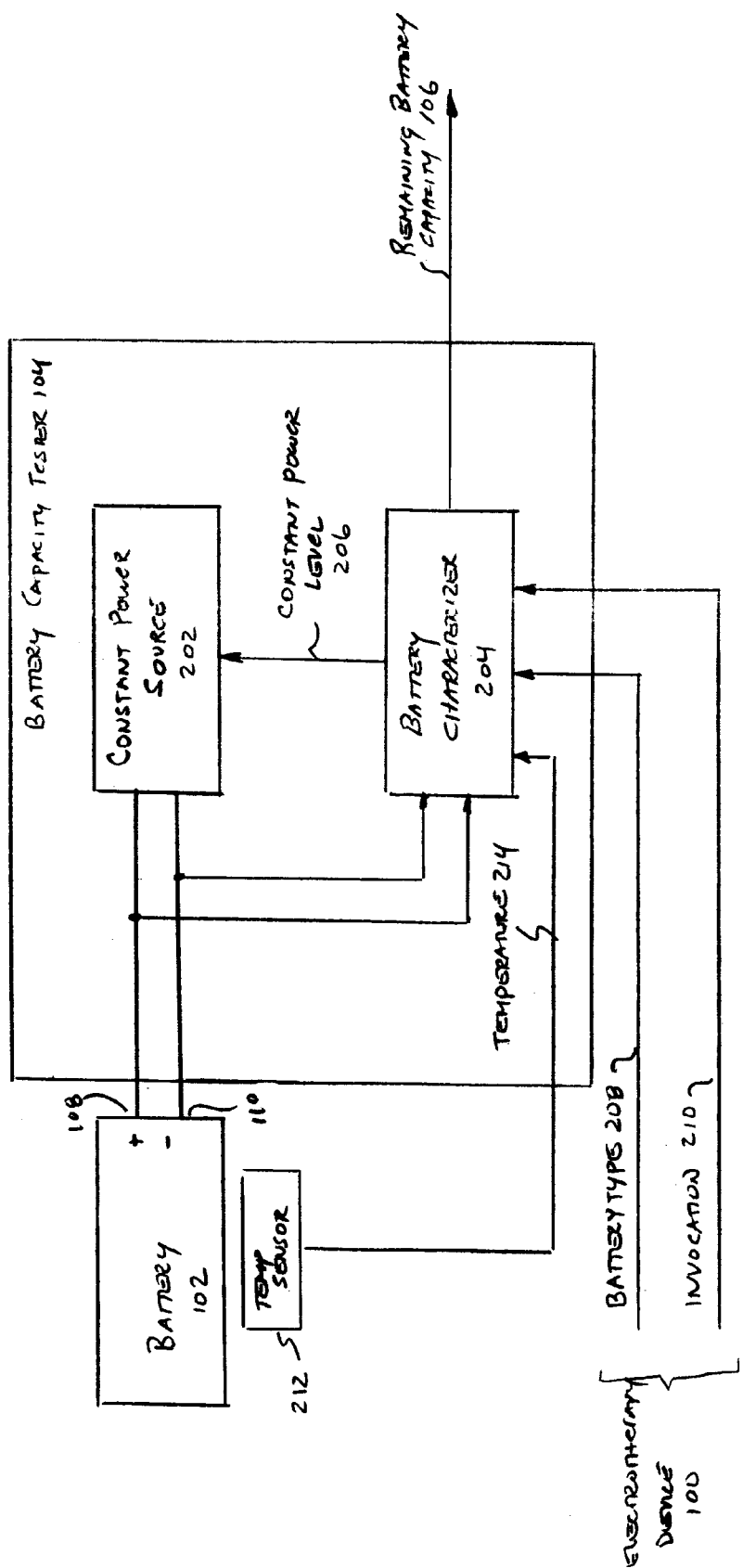
FIG. 2 is a functional block diagram of one embodiment of the battery capacity tester of the present-invention.

FIG. 2 is a block diagram of one embodiment of constant power battery capacity tester 104. Battery capacity tester 104 is shown to have two primary functional components: a constant power source 202 and a battery characterizer 204. Constant power source 202 draws a specified amount of substantially constant power from battery 102. In the illustrative embodiment, the applied power level is determined by battery characterizer 204 and is provided to constant power source 202 as an instruction 206. Constant power source 202 draws a substantially constant power during a measurement period by adjusting the current draw from battery 102 in response to detected changes in battery terminal voltage.

Battery characterizer 204 determines the amount of power to be drawn by constant power source 202 during each measurement of the capacity test. As noted, this information is provided to constant power source 202 as constant power level 206. Battery characterizer 204 may specify one or more power levels 206. The power level(s) are selected based on any number of battery characteristics and test conditions such as the chemistry and voltage rating of battery 102. The voltage across positive and negative terminals 108, 110 of battery 102 is sensed by battery characterizer 204 during each measurement period; that is, during each application of a constant power load.

In accordance with aspects of the present invention, the remaining battery capacity is determined based on a comparison of battery voltage or impedance values measured during application of one or more constant power loads with a pre-characterized relationship between battery capacity and the battery voltage or impedance. The referenced pre-characterized relationship is one of a plurality of pre-characterized relationships, each corresponding to batteries having certain characteristics and certain test conditions. The referenced pre-characterized relationship is that relationship corresponding to batteries having characteristics most similar to those characteristics of the battery and having been characterized under conditions similar to the current test conditions. In one embodiment, the battery capacity is determined based on a pre-characterized relationship between internal battery impedance and remaining battery capacity for the given battery chemistry, approximately the same temperature and similar applied constant power loads. This embodiment, which can be used, for example, to determine the remaining battery capacity of a battery 102 that cannot be reasonably well characterized with the application of a single power load or which does not exhibit reasonably predictable behavior, is described in detail below with references to FIGS. 4A, 5A and 6A.

In another embodiment, the battery capacity is determined based on pre-characterized relationship between battery terminal voltage and remaining battery capacity for the same or similar battery characteristics and under the same or different test conditions. This embodiment, which can be used, for example, to determine the remaining battery capacity of batteries 102 that can be reasonably well characterized with the application of a single power load and which exhibit reasonably predictable behavior, is described in detail below with references to FIGS. 4B, 5B and 6B.

As is well known, the performance of a battery can be dependent upon the temperature of the battery. As shown in FIG. 2, battery capacity tester 104 preferably considers the temperature of battery 102 when determining remaining battery capacity 106. That is, battery temperature is one of the test conditions included in the pre-characterization of battery capacity and internal impedance, and is one of the conditions utilized to select which of a plurality of pre-characterized relationships will be referenced to determine remaining battery capacity. In one embodiment, a temperature sensor 212 provides a signal indicative of ambient temperature around battery 102, referred to herein as battery temperature 214. Sensor 212 can be any temperature sensor now or later developed that can sense directly or indirectly the temperature of battery 102. In the exemplary embodiment, battery capacity tester 104 does not include temperature sensor 212 but instead utilizes the signal generated therefrom. It should be understood, however, that temperature sensor 212 may be incorporated into battery capacity tester 104 in alternative embodiments, such as when battery capacity tester 104 is located adjacent to power module port 103. As one of ordinary skill in the art would find apparent, the present invention may take into consideration other test conditions. For example, if the performance of certain types of batteries is dependent on age, then such conditions are measured or controlled when obtained pre-characterization data. Additional sensors suitable for detecting such test conditions can be included, and battery characterizer 204 can be modified to consider such conditions when selecting and accessing pre-characterized relationship data.

As noted, battery capacity tester 104 determines remaining battery capacity 106 based in part on characteristics of battery 102. In particular, the chemistry of battery 102 is considered in the disclosed aspects of the invention. In the embodiment illustrated in FIG. 2, battery capacity tester 104 receives a battery type indication 208 that includes such information. In an alternative embodiment, battery capacity tester 104 determines the relative characteristics of battery 102 itself, for example, by monitoring certain conditions of battery 102, by retrieving such information stored in a memory device incorporated in battery 102, etc. It should be understood that additional battery characteristics can also be considered in alternative embodiments of the present invention. For example, the voltage of each cell of battery 102 may be monitored in those batteries in which the remaining battery capacity 106 may be misleading when a cell imbalance condition occurs.

Battery capacity tester 104 measures the remaining capacity 106 of battery 102 in response to an invocation command 210. In the embodiment shown in FIG. 2, such an invocation command 210 is generated from the implementing electrotherapy device 100. For example, the system may invoke battery capacity tester 104 periodically and/or in response to an operator request. In an alternative embodiment, battery capacity tester 104 generates invocation command 210 itself, that is, it measures the remaining capacity of battery 102 based on conditions monitored or maintained by battery capacity test 104. For example, battery capacity tester 104 may perform the measurements periodically, each time a new battery type 208 is received, when the terminal voltage of the battery 102 falls below certain predetermined thresholds.

Figure 3:
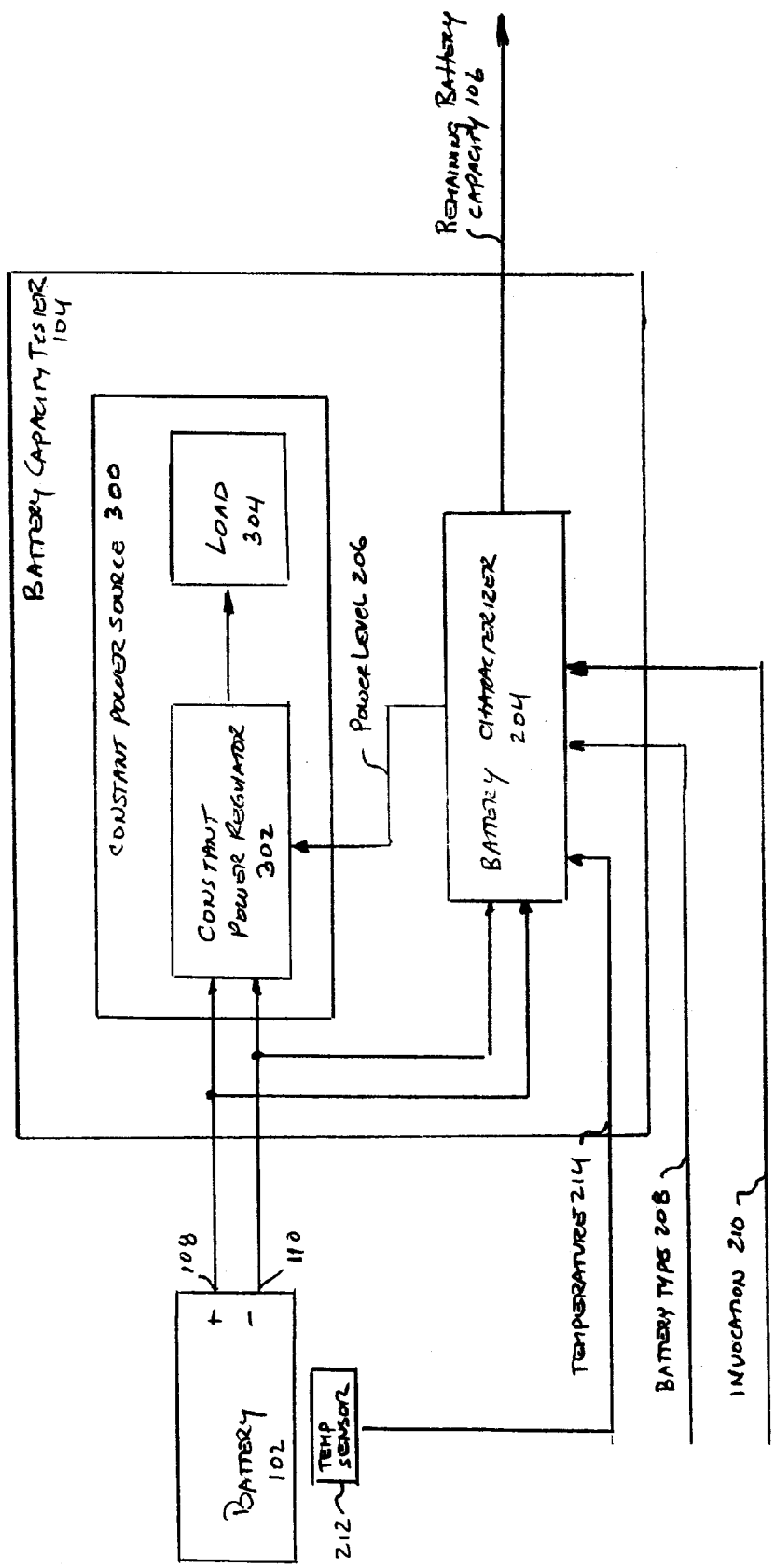
FIG. 3 is a block diagram of one embodiment of the constant power source illustrated in FIG. 2.

FIG. 3 is a block diagram of battery capacity tester 104 illustrating one embodiment of constant power source 202, referred to herein as constant power source 300. As noted, in response to an instruction provided by battery characterizer 204, constant power source 300 draws a substantially constant power from battery 102 by adjusting through a measurement period the current drawn from battery 102 based on a sensed terminal voltage. In the illustrative embodiment, constant power source 300 includes a load 304 and a constant power regulator 302. Load 304 is any well-known device that draws current. Load 304 may be any load that is well characterized in terms of its voltage and current relationship. In the noted application in which battery capacity tester 104 is implemented in electrotherapy device 100, load 304 is implemented as capacitor 108.

Constant power source 300 also includes a constant power regulator 302 that controls the current consumed by load 304. Constant power regulator 302 is electrically connected to terminals 108, 110 of battery 102 and regulates the current drawn from battery 102 in accordance with the specified power level 206. Constant power regulator 302 utilizes well-known techniques to monitor the instantaneous terminal voltage of battery 102 and to adjust the current flow from battery 102 to maintain the specified constant power 206.

Preferably, constant power regulator 302 and load 304 are configured to draw a constant power over a wide range of anticipated types of batteries 102. For example, should the constant power regulator 302 sense a battery voltage of 14 volts, it will adjust the current drawn from battery 102 to 7.14 amps to achieve a power draw of 100 watts. Should the sensed terminal voltage decrease to 10 volts, constant power regulator 302 increases the current draw to 10 amperes to maintain a constant 100 watt load on battery 102.

As noted, in one embodiment, constant power source 202 is included in a battery capacity tester 104 implemented in electrotherapy device 100. In such an embodiment, constant power regulator 302 is implemented as capacitor charger 110. Such a component is particularly useful for such purposes because it draws substantial current and has a well-established voltage and current relationship. In addition, the use of such components eliminates the need to include specialized components that would otherwise perform the same function. In one particular embodiment, constant power regulator 302 is implemented with the capacitor charging system described in commonly owned U.S. Utility Patent Application No.: 09/620,446, entitled "System and Method for Charging A Capacitor Using a Constant Frequency, Current Waveform," filed on Jul. 20, 2000, and naming as inventor Gregory D. Brink, the specification of which is hereby incorporated by reference herein in its entirety.

Figure 4A:
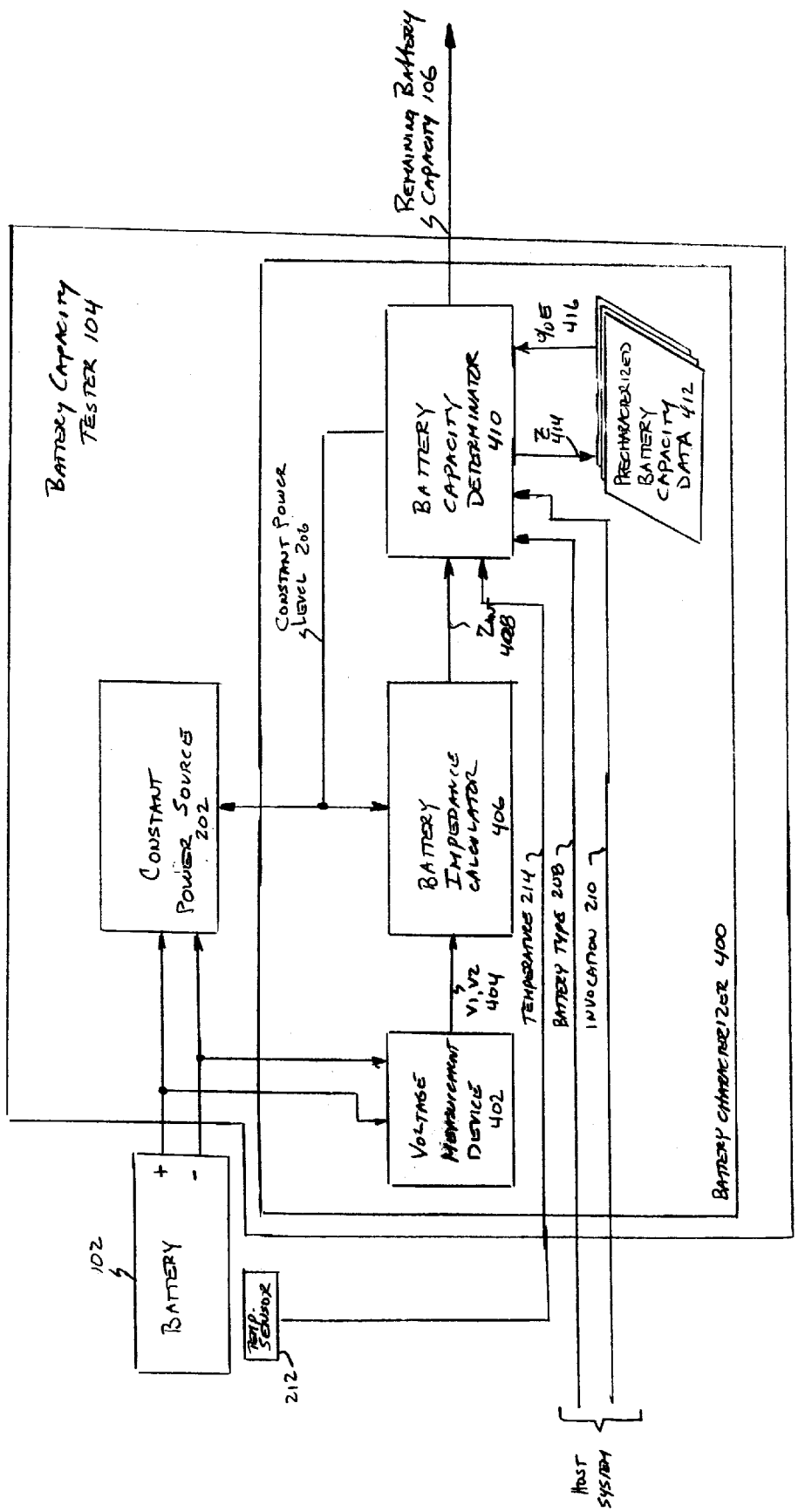
FIG. 4A is a block diagram of one embodiment of the battery characterizer of the present invention.

FIG. 4A is a block diagram of one embodiment of battery characterizer 204, referred to as battery characterizer 400. In this embodiment, battery characterizer 400 determines remaining battery capacity based on a pre-characterization relationship between battery impedance and battery capacity. Battery capacity tester 104 includes constant power source 202 described above. As noted, constant power source 202 draws a specified amount of power from battery 102. Battery characterizer 400 determines the amount of power to be drawn by constant power source 202 during each measurement. This embodiment of battery characterizer 400 performs two or more successive battery measurements to determine remaining battery capacity. Accordingly, battery capacity determinator 410 generates specifications for two or more predetermined power levels 206 and constant power source 202 draws the two specified quantities of power from battery 102. This is described in detail below.

As constant power source 202 draws specified power 206 from battery 102, a voltage measurement device 402 of battery characterizer 400 measures the voltage across terminals 108 and 110 of battery 102. Voltage measurement device 402 can be any well-known voltage measurement device now or later developed that can accurately measure terminal voltages of the installed battery 102 to be implemented in the particular application. Voltage measurement device 402 generates the terminal voltages $v_1$ and $v_2$ 404 measured during the first and second applications, respectively, of a constant power load 206.

In one embodiment, voltage measurement device 402 includes an analog-to-digital converter subsystem. The design of an appropriate analog filter, sampler, and analog-to-digital converter is considered to be well within the ordinary skill in the art. The number of bits of the analog-to-digital converter will depend on the particular application. In one embodiment, a 12-bit converter is utilized.

A battery impedance calculator 406 receives terminal voltages 404 and calculates the internal battery impedance ($Z_{int}$) 408 of battery 102. In this embodiment of the invention, battery impedance 404 is calculated based on the applied power levels 206 and corresponding terminal voltages 404. Internal battery impedance 408 is determined by Equation (1):

$$z_{int} = \left| \frac{v_1 - v_2}{i_1 - i_2} \right| \qquad \text{Equation (1)}$$

where $v_1$ and $v_2$ are the battery terminal voltages measured during each constant power load application; and $i_1$ and $i_2$ are the currents drawn from battery 102 during each such application.

The current drawn from battery 102 is related to the applied power and battery terminal voltage as set forth in Equations (2) and (3).

$$i_1 = \frac{P_1}{v_1} \qquad \text{Equation (2)}$$

$$i_2 = \frac{P_2}{v_2} \qquad \text{Equation (3)}$$

Thus, Equation (1) can be rewritten as Equation (4):

$$z_{int} = \left| \frac{v_1 - v_2}{\frac{P_1}{v_1} - \frac{P_2}{v_2}} \right| \quad \text{Equation (4)}$$

where, $P_1$ and $P_2$ are applied constant power levels 206. Thus, battery impedance calculator 406 receives constant power levels 206 from battery capacity determinator 410 and which are also applied to constant power source 202. Battery impedance calculator 406 also receives voltages 404 from voltage measurement device 402 measured during the application of the respective power loads, and calculates internal battery impedance 408 based thereon.

It should be understood that, to accurately perform successive measurements, the power drawn from battery 102 should be sufficiently large so that a measurable difference between the first and second voltages 404 occurs. The amount of power to be drawn from battery 102, therefore, is dependent upon the size and capacity of the battery being tested. It would be obvious to one of ordinary skill in the art that the selected power levels 206 can be chosen based on the sensitivity of the voltage measurement and the characteristics of battery 102, among other factors.

Battery capacity determinator 410 determines the remaining capacity of battery 102 based on a pre-characterized relationship between battery impedance 408 and battery capacity 416. The relationship between battery capacity (that is, the percentage of energy remaining in battery 102, or % E) and battery terminal voltage (v) may be expressed by a mathematical function implemented in a computational device. For example, an algorithm implemented in software, firmware, hardware (such as an ASIC) can embody such a mathematical function. Alternatively, the relationship between capacity and voltage can be stored as data in a memory device. An example of such an implementation is illustrated in the embodiment of FIG. 4A, wherein pre-characterized battery capacity data is provided in a series of look-up tables 412. Look-up tables 412 can be stored in any type of memory device accessible to battery capacity determinator 410.

The relationship between battery impedance (Z) 408 and battery capacity (% E) varies according to the chemistry of battery 102 (C), the temperature of the battery (T) at the time the constant power loads are applied to battery 102, as well as the two applied constant power levels (P1, P2). In the embodiment illustrated in FIG. 4A, a series of look-up tables 412 are provided. Each table 412 contains data representing the relationship between battery capacity and battery impedance for a given combination of chemistry and temperature.

Thus, battery capacity determinator 410 selects a look-up table 412 using chemistry (C) 208 and temperature (T) 214. In one embodiment, battery capacity determinator 410 identifies the appropriate look-up table 412 by maintaining a series of look-up table identifiers. Each such identifier may be a pointer, path or name of a look-up table 412. Each pointer is associated with a different chemistry, temperature and applied power levels. This association is maintained by battery capacity determinator 410 in any well known fashion. A summary of the look-up tables 412 and the associated temperature, chemistry and power levels that can be implemented in one embodiment of the invention is illustrated in FIG. 5A.

FIG. 5A shows in table form the data associations maintained by battery capacity determinator 410 in this embodiment of the invention. In this example, the first 17 look-up tables 412 (rows 1–17) are for NiCd batteries. The first 8 tables (rows 1–8) correspond to the application of a constant 2 watt power load to the NiCd battery. The next 8 tables (rows 9–16) correspond to the application of a constant 5 watt power load to the NiCd battery. The next table (row 17) corresponds to other possible constant power loads. Returning to rows 108, for two applied power levels of 2 and 8 watts, each of the 8 look-up tables 412 corresponds to a different sensed ambient temperature (T). This indicates that a NiCd battery is one type of battery 102 that can be installed in electrotherapy device 100, and that battery capacity tester 410 tests such batteries with constant power loads of 2 and 8 watts, and that the anticipated operational temperatures for the device range from –10 to 60° C.

Table 500 illustrates other battery types, power loads and temperatures. It should be understood that the number and content of look-up tables 412 reflects the pre-characterization activities performed in anticipation of the battery types that will be implemented and the anticipated operational temperatures. The power loads are selected to cause a sufficient current draw to achieve an accurate indication of battery capacity. Accordingly, look-up tables 412 contains pre-characterized battery capacity data corresponding to virtually any combination of battery type, temperature and power loads.

The referenced look-up tables 412, as noted, contain the corresponding relationship between battery impedance and capacity. Once the appropriate table 412 is selected, battery capacity determinator 410 accesses the selected table 412 with a query 414 of calculated impedance (Z) 408 to retrieve the corresponding remaining capacity (% E) 416. In one embodiment, the determination of the relationship between the internal battery impedance and the remaining battery capacity is based upon measurements gathered empirically from battery 102. It would be obvious to one of skill in the art that the data should be gathered from a statistically significant number of batteries to produce data having a sufficient confidence interval and accuracy.

In an alternative embodiment, a microprocessor may be used to increase the accuracy of the outputs based upon the data contained within look-up tables 412. Such a microprocessor provides for a more accurate determination of both internal battery impedance and remaining battery capacity when there is no data entry corresponding exactly to the voltage or current difference. The process of interpolation is considered to be known to those skilled in the relevant art.

In another embodiment, empirically collected data as described above can be analyzed and a mathematical function derived therefrom. Many different curve-fitting functions or approximation techniques may be used. In one embodiment, a least-squared technique is used to derive polynomial functions approximating the relationship between the remaining battery capacity data and the internal battery impedance. In an alternative embodiment, any suitable set of basic functions can be used to derive mathematical functions approximating the relationship between the remaining battery capacity and the internal battery impedance. In such embodiments, the computation of accessing the look-up table to determine battery capacity can be implemented in firmware or an ASIC.

Figure 6A:
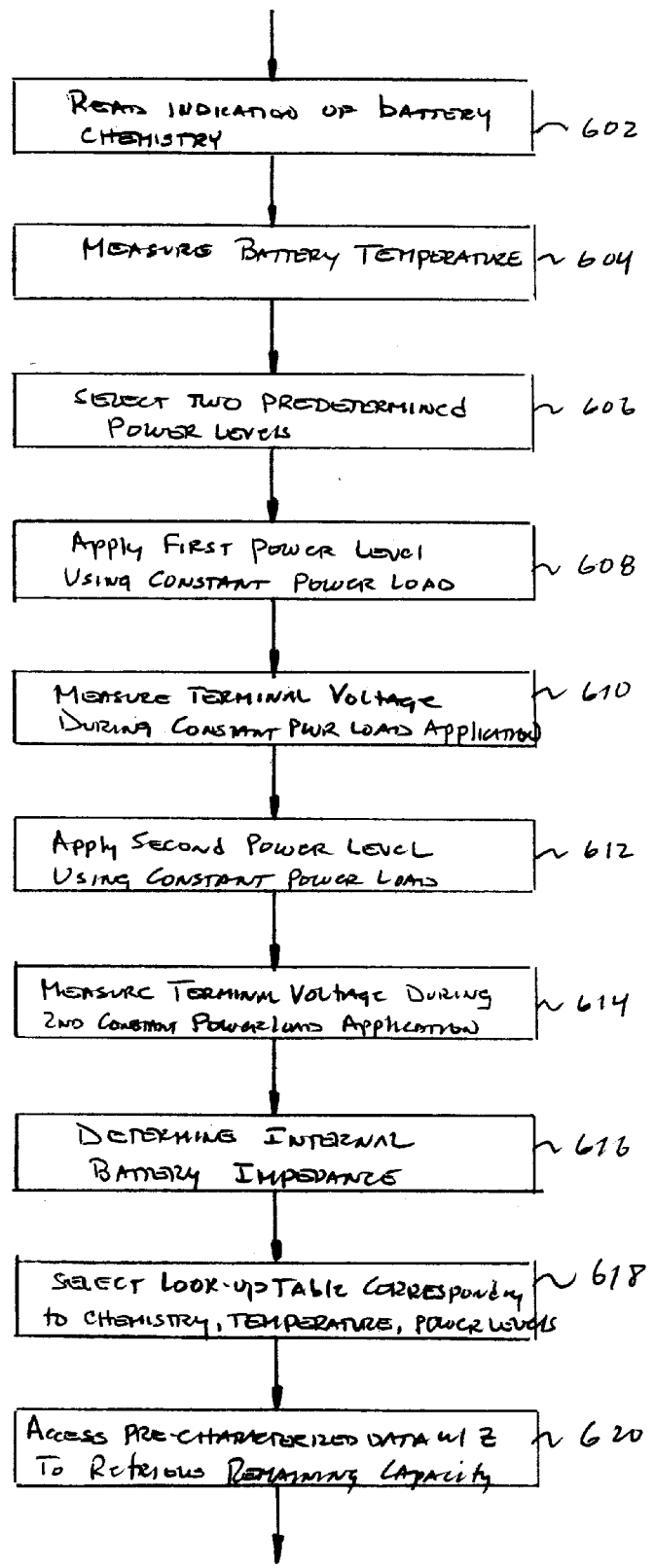
FIG. 6A is a flowchart for a process of executing one embodiment of the present invention.

FIG. 6A is a flow chart of the processes performed in accordance with one embodiment of battery characterizer 400 when calculating and using battery impedance to determine remaining battery capacity. In process 600, battery capacity determinator 410 reads battery type 208 at block 602. Battery type 208 includes an indication of the chemistry of battery 102. Temperature 214 generated by temperature sensor 212 is measured at block 604. Based on battery chemistry and temperature and, perhaps one or more other factors, battery capacity determinator 410 instructs constant power source 202 to successively apply a constant power load at two or more power levels P1, P2 at block 606. A first power load is applied at block 608 and the resulting terminal voltage is measured at block 610. The second power load is applied at block 612, with the corresponding voltage measured at block 614.

The corresponding internal battery impedance 408 is calculated at block 616 based on the applied measured voltages. Based on the battery chemistry, power levels and temperature, a table 412 is selected at block 618. The selected look-up table 412 is accessed at block 620 with the battery impedance (Z) and the corresponding capacity value (% E) 416 is retrieved. This value is generated as remaining battery capacity 106.

This embodiment in which the relationship between battery impedance and capacity is used to determine remaining capacity can be implemented at any time and with any battery chemistry or test conditions. This approach is particularly useful when battery 102 is not demonstrating reasonably predictable behavior. In such circumstances, determination of internal battery impedance based on multiple applications of a constant power load eliminates the inaccuracies that could otherwise occur due to the battery behavior. However, oftentimes battery 102 behaves consistently and predictably. In such circumstances, the battery capacity can be determined based on pre-characterized relationship between battery terminal voltage and remaining battery capacity, as described below.

Figure 4B:
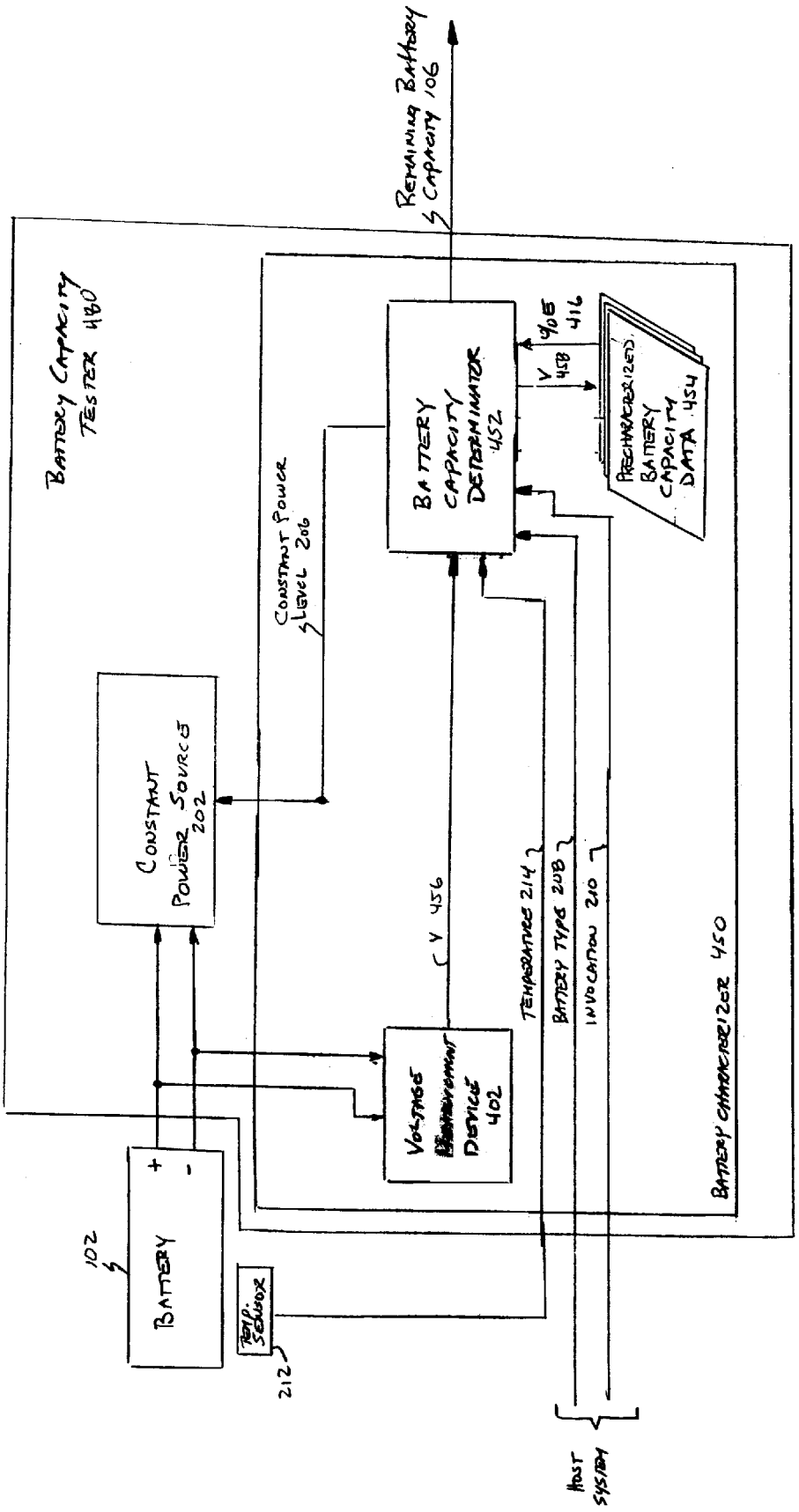
FIG. 4B is a block diagram of another embodiment of the battery characterizer of the present invention.

FIG. 4B is a block diagram of one embodiment of battery characterizer 204 that determines battery capacity based on a single voltage measurement, referred to as battery characterizer 450. In this embodiment, battery characterizer 450 determines remaining battery capacity based on a pre-characterized relationship between battery voltage and battery capacity for a given set of one or more battery characteristics and test conditions. In the illustrative embodiment, this includes the temperature and chemistry of battery 102.

Battery capacity tester 480 includes constant power source 202, described above, and a battery capacity determinator 452 that determines the amount of power to be drawn by constant power source 202 during a single measurement. As noted above with reference to FIG. 4A, constant power source 202 draws specified power 206 from battery 102 while voltage measurement device 402 measures the voltage across terminals 108 and 110 of battery 102. In this embodiment, voltage measurement device 402 generates a single terminal voltage value (v) 456 rather than multiple such values as in the embodiment illustrated in FIG. 4A. This quantity is provided to battery capacity determinator 452.

Battery capacity determinator 452 determines the remaining capacity of battery 102 based on a pre-characterized relationship between battery voltage 408 and battery capacity 416. As in the embodiment noted above, the relationship between battery capacity and battery voltage may be expressed by a mathematical function implemented in a computational device or can be stored as data values in memory. In this exemplary embodiment, the pre-characterized battery capacity data is provided in a series of look-up tables 454.

The relationship between battery voltage and battery capacity varies according to battery chemistry (C) and battery temperature (T) as well as the constant power load (P) applied to battery 102. In the embodiment illustrated in FIG. 4B, a series of look-up tables 454 are provided. Each table 454 provides the data associating capacity and voltage for a given chemistry, temperature and applied constant power level.

In one embodiment, battery capacity determinator 452 identifies the appropriate look-up table 454 to be referenced during a measurement by maintaining a series of look-up tables 454 identifiers. Each such identifier may be a pointer, path or name of a look-up table 454. Each pointer is associated with a different chemistry, temperature and applied power level. FIG. 5B illustrates in table form the data associations maintained by battery capacity determinator 410. Table 550 provides a sample of the look-up tables 454 with corresponding temperature, chemistry and power level. Table 550 is similar to table 500 except that a single constant power load is provided. As with Table 500, any number of look-up tables 454 with any combination of pre-characterization data can be implemented.

Once the appropriate table 454 is selected, battery capacity determinator 452 accesses the selected table 454 with a query 458 of battery voltage 456 to retrieve the corresponding remaining capacity (% E) 416. In one embodiment, the determination of the relationship between the battery voltage and remaining battery capacity is based upon measurements gathered empirically from a statistical number of batteries 102 in the anticipated operating environment, as noted above. In other embodiments, the empirically collected capacity and voltage data can be analyzed and a mathematical function derived therefrom.

Figure 6B:
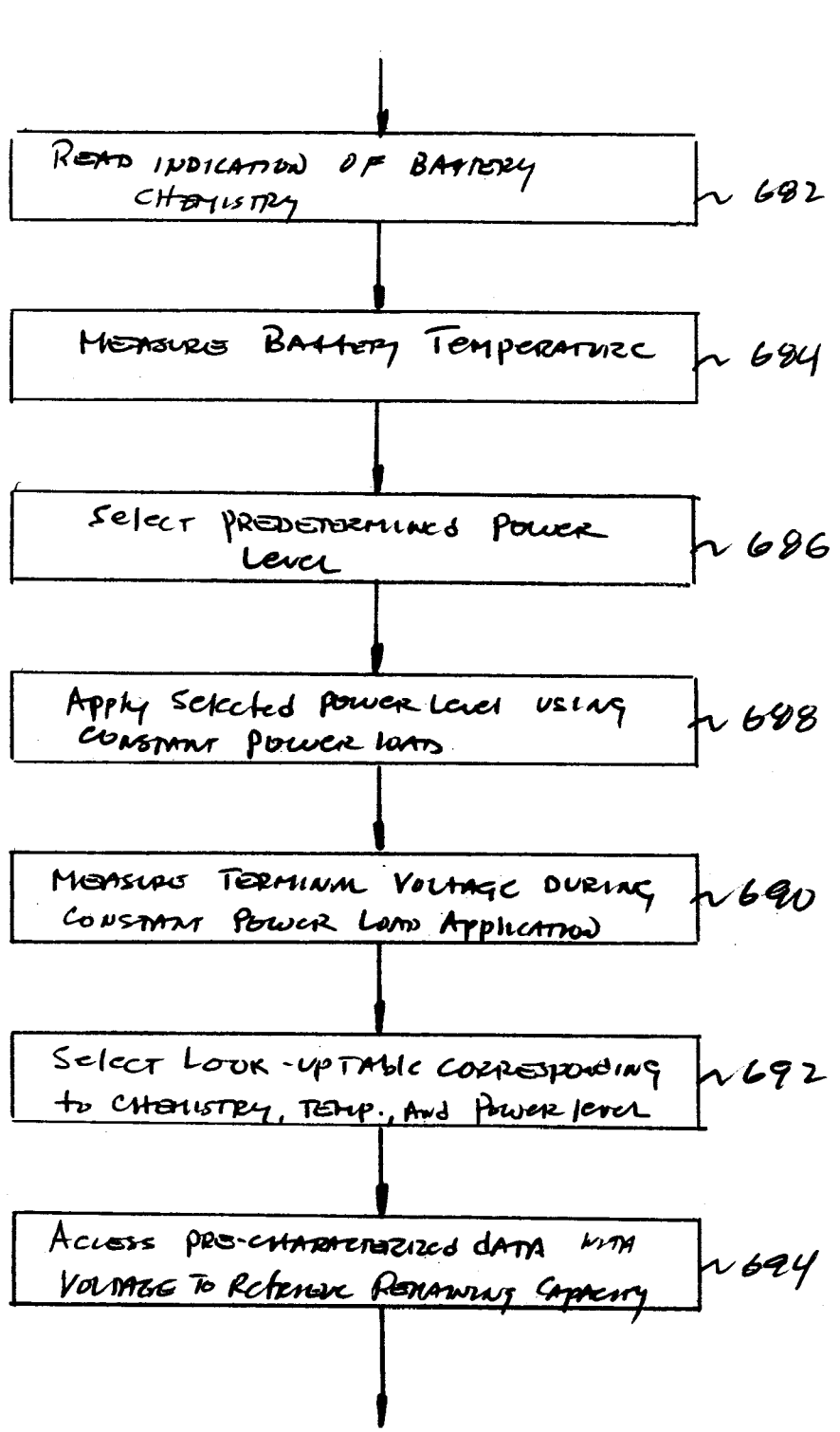
FIG. 6B is a flowchart for a process of executing another embodiment of the present invention.

FIG. 6B is a flow chart of the processes performed in accordance with one embodiment of battery characterizer 400 when calculating and using battery voltage to determine remaining battery capacity. At block 682, battery capacity determinator 454 receives battery type 208 which includes an indication of the chemistry of battery 102 and, perhaps the voltage rating of the battery. Temperature 214 generated by temperature sensor 212 is received at block 684. Based on battery chemistry, temperature and the predetermined power level that is to be applied, battery capacity determinator 452 instructs constant power source 202 to apply a constant power load at the predetermined power level P at block 608. The terminal voltage is measured during each such constant power load application at block 690. Based on the battery chemistry, power levels and temperature, a table 412 is selected at block 692. The selected look-up table 454 is accessed at block 696 with the battery voltage (V) and the corresponding capacity value (% E) 416 is retrieved. This value is generated as remaining battery capacity 106.

It should be understood that various changes and modifications of the embodiments shown in the drawings and described in the specification may be made within the spirit and scope of the present invention. For example, the battery capacity testers of the present invention may perform the above-described operations repetitively with the same or different power levels to increase accuracy. In such embodiments, some form of arbitration scheme may also be implemented to determine the remaining battery capacity when multiple such measurements result in different remaining battery capacities. In another embodiment, battery capacity test 104 implements both embodiments described above, and implements some form of rationale for selecting which approach is preferred for any given battery or measurement operation. Further, it should be clear that the present invention can be implemented in any battery-powered device. Accordingly, it is intended that all matter contained in the above description and shown in the accompanying drawings be interpreted in an illustrative and not in a limiting sense. The invention is limited only as defined in the following claims and the equivalents thereto.

What is claimed is:

1. A battery capacity tester for determining a remaining capacity of a battery coupled to the tester, wherein said tester applies one or more constant power loads to the battery and compares a selected one of either a measured battery voltage or calculated battery impedance to a pre-characterized relationship between battery capacity and said selected voltage or impedance for certain battery characteristics and test conditions.

2. The battery capacity tester of claim 1,
wherein said one or more applications of a constant power load comprises one application of a predetermined constant power load, and
wherein said tester determines the remaining battery capacity based on a pre-characterized relationship between battery voltage and capacity for the battery at said one applied constant power load.

3. The battery capacity tester of claim 2, comprising:
a constant power source, coupled to the battery, configured to apply said predetermined constant power load; and
a battery characterizer configured to measure said battery voltage during said application of said predetermined constant power load, and to determine said remaining battery capacity based on said pre-characterized relationship between said measured battery voltage and battery capacity, wherein the pre-characterized relationship corresponds with batteries having similar characteristics under similar test conditions.

4. The battery capacity tester of claim 3, wherein said similar battery characteristics comprises one or more of the group consisting of battery chemistry and battery voltage rating, and wherein said similar test conditions comprises one or more of the group consisting of applied constant power load, temperature, etc.

5. The battery capacity tester of claim 3, wherein said battery characterizer comprises:
a voltage measurement device configured to measure said battery terminal voltage;
a memory having stored therein pre-characterized data associating said battery voltage and said battery capacity for a corresponding battery chemistry and applied constant power load; and
a battery capacity determinator configured to retrieve a battery capacity value from said memory based on said measured battery voltage, chemistry of the battery and said applied constant power load.

6. The battery capacity tester of claim 5, wherein said pre-characterized data also corresponds to battery temperature, and wherein said battery capacity determinator retrieves said remaining battery capacity also based on a sensed temperature of the battery.

7. The battery capacity tester of claim 6, wherein said pre-characterized data associating said battery voltage and said battery capacity is stored in a plurality of look-up tables each containing pre-characterized data for a given battery chemistry, applied constant power load and temperature.

8. The battery capacity tester of claim 7, wherein said constant power source comprises:
a load that consumes power; and
a constant power regulator coupled to the battery and said load, to control electrical connection of said load to the battery to provide said constant power load application.

9. The battery capacity tester of claim 8, wherein said battery capacity tester is implemented in a defibrillator, and wherein said load is a bank of one or more capacitors of said defibrillator, and said constant power regulator is a capacitor charging device of said defibrillator that charges said bank of one or more capacitors such that said load draws power at said indicated power level.

10. The battery capacity tester of claim 8,
wherein said battery capacity tester is implemented in an electrotherapy device, and
wherein said load comprises one or more capacitors of the electrotherapy device, and
said constant power regulator is a capacitor charging device that charges said bank of one or more capacitors such that said load draws constant power at said indicated power level.

11. The battery capacity tester of claim 10, wherein said electrotherapy device is a defibrillator.

12. The battery capacity tester of claim 11, wherein said defibrillator is an automatic external defibrillator.

13. The battery capacity tester of claim 6, wherein said pre-characterized data associating said battery impedance and said battery capacity is stored in a plurality of look-up tables each containing pre-characterized data for a given battery chemistry, applied differences in said first and second constant power loads, and battery temperature.

14. The battery capacity tester of claim 11, wherein said battery characterizer comprises:
a computational element constructed and arranged to calculate said remaining battery capacity based on said predetermined relationship between said battery impedance and said remaining battery capacity for a given battery chemistry and said sensed ambient temperature.

15. The battery capacity tester of claim 12, wherein said computational element implements the following relationship to determine said internal battery impedance (z):

$$z_{int} = \left| \frac{v_1 - v_2}{\frac{P_1}{v_1} - \frac{P_2}{v_2}} \right|$$

where, Z is internal battery impedance, $P_1$ and $P_2$ are applied constant power levels and v1, v2 are the battery voltages measured during application of constant power loads P1 and P2, respectively.

16. The battery capacity tester of claim 3, wherein said battery characterizer comprises:
a voltage measurement device configured to measure said battery terminal voltage; and
a computational element constructed and arranged to calculate said remaining battery capacity based on said predetermined relationship between said battery voltage and said remaining battery capacity, wherein said pre-characterized relationship is a function of battery chemistry, battery temperature and said applied constant power level.

17. The battery capacity tester of claim 16, wherein said constant power source comprises:
a load that consumes power; and
a constant power regulator coupled to the battery and said load, to control electrical connection of said load to the battery to provide said constant power load application.

18. The battery capacity tester of claim 1,
wherein said one or more applications of a constant power load comprises a first application of first predetermined constant power load, and a second application of second predetermined constant power load and wherein said sensed battery voltage comprises a first battery voltage measured during said first constant power application and a second battery voltage measured during said second constant power application, and wherein said tester determines the remaining battery capacity based on a pre-characterized relationship between internal battery impedance and battery capacity, wherein said impedance is derived from a relationship between said first and second battery voltages and said first and second applied power loads.

19. The battery tester of claim 18, wherein the battery capacity tester comprises:

a constant power source configured to apply, in two successive occurrences, said first and second predetermined constant power loads; and a battery characterizer configured to provide said constant power source with an indication of each said predetermined constant power load and to sense said first and second battery voltages and an ambient temperature during each said first and second constant power applications, and to determine said remaining battery capacity based on said battery impedance, said ambient temperature and a battery chemistry.

20. The battery capacity tester of claim 19, wherein said battery characterizer comprises:

a voltage measurement device configured to measure said battery terminal voltage;

a memory having stored therein pre-characterized data associating said battery impedance and said battery capacity for a corresponding battery chemistry and applied constant power loads; and a battery capacity determinator configured to retrieve a battery capacity value from said memory based on said measured battery voltage, chemistry of the battery and said applied constant power loads.

21. An electrotherapy device comprising:

an energy delivery system including one or more capacitors and a capacitor charger; and a battery capacity tester constructed and arranged to determine a remaining capacity of a battery installed in the electrotherapy device, wherein said tester applies one or more constant power loads to the battery and compares a selected one of either a measured battery voltage and calculated battery impedance to a pre-characterized relationship between battery capacity and said selected voltage or impedance for batteries having a same chemistry and temperature as the installed battery when subject to a same constant power loads as said one or more constant power loads.

22. The electrotherapy device of claim 21, wherein said one or more applications of a constant power load comprises one application of a predetermined constant power load, and wherein said tester determines the remaining battery capacity based on a pre-characterized relationship between battery voltage and capacity for the battery at said one applied constant power load.

23. The electrotherapy device of claim 21, wherein said one or more applications of a constant power load comprises a first application of first predetermined constant power load, and a second application of second predetermined constant power load and wherein said sensed battery voltage comprises a first battery voltage measured during said first constant power application and a second battery voltage measured during said second constant power application, and wherein said tester determines the remaining battery capacity based on a pre-characterized relationship between internal battery impedance and battery capacity, wherein said impedance is derived from a relationship between said first and second battery voltages and said first and second applied power loads.

24. The electrotherapy device of claim 21, wherein said electrotherapy device is an automatic external defibrillator.

25. A method for determining remaining battery capacity of a tested battery, the method comprising the steps of:

1) receiving indications of battery chemistry and temperature;

2) applying successively a first and a second constant power load to the battery;

3) measuring first and second terminal voltages of the battery during each constant power load application performed in step 2);

4) calculating internal battery impedance based on said applied constant power levels and said corresponding first and second measured voltages; and 5) determining remaining battery capacity based on a pre-characterized relationship of battery impedance and battery capacity for batteries having a same chemistry and temperature as the tested battery subject to same first and second power loads as said tested battery.

26. A method for determining remaining battery capacity of a tested battery, the method comprising the steps of:

1) receiving indications of battery chemistry and temperature;

2) applying a constant power load to the battery;

3) measuring a terminal voltage of the battery during said constant power load application performed in step 2); and 5) determining remaining battery capacity based on a pre-characterized relationship of battery voltage and battery capacity for batteries having a same chemistry and temperature as the tested battery subject to same constant power load as said tested battery.

* * * * *